US007086872B2

(12) United States Patent
Myer et al.

(10) Patent No.: US 7,086,872 B2
(45) Date of Patent: Aug. 8, 2006

(54) TWO PIECE SURFACE MOUNT HEADER ASSEMBLY HAVING A CONTACT ALIGNMENT MEMBER

(75) Inventors: John Mark Myer, Millersville, PA (US); Hurley Chester Moll, Harrisburg, PA (US); Daniel Williams Fry, Jr., Elizabethtown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/069,427

(22) Filed: Mar. 1, 2005

(65) Prior Publication Data

US 2005/0148219 A1 Jul. 7, 2005

Related U.S. Application Data

(63) Continuation-in-part of application No. 10/718,371, filed on Nov. 20, 2003.

(51) Int. Cl.
*H01R 12/00* (2006.01)
*H01R 4/02* (2006.01)
*H05K 1/00* (2006.01)

(52) U.S. Cl. ........................................ 439/78; 439/876

(58) Field of Classification Search .................. 439/78, 439/79, 83, 84, 606, 567, 876
See application file for complete search history.

(56) References Cited

U.S. PATENT DOCUMENTS

| | | | | |
|---|---|---|---|---|
| 4,762,500 | A | | 8/1988 | Dola et al. |
| 4,960,391 | A | | 10/1990 | Beinhaur et al. |
| 5,133,670 | A | * | 7/1992 | Doi et al. ..................... 439/79 |
| 5,281,160 | A | | 1/1994 | Walkup et al. |
| 5,336,116 | A | | 8/1994 | Boteler |
| 5,451,158 | A | | 9/1995 | Lin et al. |
| 5,487,674 | A | | 1/1996 | Guzik et al. |
| 5,667,393 | A | | 9/1997 | Grabbe et al. |
| 5,697,799 | A | | 12/1997 | Consoli et al. |
| 5,772,474 | A | | 6/1998 | Yagi et al. |
| 6,135,781 | A | | 10/2000 | Pope et al. |
| 6,338,630 | B1 | | 1/2002 | Dong |
| 6,361,332 | B1 | | 3/2002 | Froude et al. |
| 6,419,526 | B1 | | 7/2002 | Fair et al. |
| 6,827,588 | B1 | | 12/2004 | Huang et al. |
| 2005/0009379 | A1 | | 1/2005 | Huang et al. |

* cited by examiner

*Primary Examiner*—Chandrika Prasad

(57) ABSTRACT

A header assembly includes an insulative contact housing having a plurality of walls defining an interior cavity and an insulative alignment housing having at least one alignment rib extending on an exterior surface thereof. The alignment housing is separately provided and independently mounted to the contact housing. A plurality of contacts are included within the cavity and extend through one of the walls to an exterior of the contact housing wherein the contacts flex against the alignment housing and abut the alignment rib, thereby ensuring coplanarity of the contacts for surface mounting to a circuit board.

20 Claims, 14 Drawing Sheets

TWO PIECE SURFACE MOUNT HEADER ASSEMBLY HAVING A CONTACT ALIGNMENT MEMBER

CROSS REFERENCE TO RELATED APPLICATIONS

This application is a continuation-in-part application of U.S. patent application Ser. No. 10/718,371 filed Nov. 20, 2003, which is hereby incorporated by reference in its entirety.

BACKGROUND OF THE INVENTION

This invention relates generally to electrical connectors, and, more specifically, to surface mount header assemblies for mating engagement with plug assemblies.

The mating of a plug assembly into a receptacle assembly to form a connector assembly often involves a high insertion force. This is particularly true when the connector comprises mating connector housings containing many contacts. For example, automobile wiring systems, such as power train systems, typically include electrical connectors. Typically, each electrical connector includes a plug assembly and a header assembly. The plug assembly is mated into a shroud of the header assembly. The header assembly is in turn mounted on a circuit board along a contact interface. At least some known receptacle assemblies are right angle receptacle assemblies wherein the plug assembly is mated in a direction that is parallel to the contact interface between the header assembly and the circuit board. Each of the plug assembly and the header assembly typically includes a large number of electrical contacts, and the contacts in the header assembly are electrically and mechanically connected to respective contacts in the plug assembly when the header assembly and the plug assembly are engaged. To overcome the high insertion force to connect the plug assembly into the header assembly, an actuating lever is sometimes employed to mate contacts of the plug assembly and the header assembly.

Surface mount header assemblies provide a number of advantages over through-hole mounted header assemblies. In addition to offering cost and process advantages, surface mounting allows for a reduced footprint for the header assembly and thus saves valuable space on a circuit board or permits a reduction in size of the circuit board. When the header assembly is surface mounted to a circuit board, solder tails extend from one side of the header assembly in an angled manner for surface mounting to a circuit board, and also extend substantially perpendicular from another side of the header assembly for mating engagement with contacts of the plug assembly. In one automotive connector system, fifty two contacts are employed in one version of the header assembly, and the large number of contacts presents manufacturing and assembly challenges in fabricating the header assembly, as well as installation problems during surface mounting of the header assembly to the circuit board.

For example, it is desirable for surface mounting that the solder tails of the header assembly are coplanar to one another for mounting to the plane of a circuit board. Achieving coplanarity with a large number of contact pins, however, is difficult due to manufacturing tolerances over a large number of contacts. Sometimes additional solder paste is utilized to compensate for tolerances of the contacts or for misalignment of the pin contacts during assembly of the header. Over a large number of header assemblies, however, the incremental cost of the increased amount of solder paste per header assembly can be significant, and non-planarity of the pin contacts with respect to the plane of the circuit board may negatively affect the reliability of the header assembly. Additional solder paste thickness can also cause solder bridging problems for other surface mount components on fine pitch or may require different stencils to be used. Depending upon the degree of non-planarity of the solder tails, some of the contacts may be weakly connected or not connected to the circuit board at all, either of which is an undesirable and unacceptable result.

Furthermore, the high insertion forces during engagement and disengagement of the header assembly and the plug assembly may be detrimental to the soldered connections of the header assembly. To prevent the soldered connections from being broken, a solder clip is sometimes used which is soldered to the circuit board at the corners of the header. As such, the mechanical connection of the solder clips incur the brunt of mechanical strain as the header assembly is mated and unmated from a mating connector. Tolerances in manufacturing the solder clips, however, introduce additional non-planarity issues when the header assembly is soldered to a circuit board. At one end of the tolerance range, the solder clips may prevent the contacts from fully contacting the circuit board, which may impair the quality of the soldered connections of the contacts. At the other end of the tolerance range, the solder clips may not fully contact the circuit board during soldering, which may impair the ability of the solder clips to spare the contacts from large insertion and extraction forces as the header assembly is engaged and disengaged from a mating connector.

BRIEF DESCRIPTION OF THE INVENTION

In accordance with an exemplary embodiment, a header assembly comprises an insulative contact housing having a plurality of walls defining an interior cavity and an insulative alignment housing having at least one alignment rib extending on an exterior surface thereof. The alignment housing is separately provided from and independently mounted to the contact housing. A plurality of contacts are included within the cavity and extend through one of the walls to an exterior of the contact housing wherein the contacts flex against the alignment housing and abut the alignment rib, thereby ensuring coplanarity of the contacts for surface mounting to a circuit board.

Optionally, the contact housing includes longitudinal side walls and lateral side walls defining the interior cavity, wherein one of the side walls extend along an exterior surface of the circuit board. The contact housing may include a contact interface and a plug interface for mating with a plug assembly, wherein the plug interface extends substantially parallel to and spaced apart from the contact interface, and the plug interface extends substantially perpendicular to an exterior surface of the circuit board. In an exemplary embodiment, the alignment housing may be releasably mounted to the wall through which the plurality of contacts extend, and the contacts may be preloaded against the alignment rib. The alignment rib may engage the contacts as the alignment housing is mounted to the contact housing, thereby preloading the contacts against the alignment rib. Optionally, the alignment rib may be positioned a substantially uniform distance from an engagement surface of the circuit board such that a gap is defined between the alignment edge and the engagement surface, and the contacts abutting the alignment edge substantial fill the gap.

According to another exemplary embodiment, a header assembly for engaging an engagement surface of a circuit board comprises an insulative contact housing having a plurality of walls defining an interior contact cavity and a contact interface, and an insulative alignment housing fitted over a portion of the contact housing and having a plurality of walls defining an interior alignment cavity extending proximate the contact interface. At least one alignment rib extends proximate the alignment cavity, and the alignment rib includes a planar alignment edge. A plurality of contacts include contact sections and solder tail sections, wherein the contact sections are located within the interior contact cavity, and the solder tail sections extend interior to the alignment cavity. The solder tail sections include a mounting portion abutting the alignment edge and preloaded against the alignment edge as the alignment housing is coupled to the contact housing, thereby ensuring coplanarity of the solder tail sections for surface mounting to the circuit board.

According to another exemplary embodiment, a method of assembling a surface mount header assembly is provided. The assembly includes an insulative contact housing having a plurality of walls defining an interior surface, an exterior surface and a plurality of contact apertures extending therebetween, and an insulative alignment housing having a plurality of walls defining an interior surface, an exterior surface and an alignment rib extending on the exterior surface. The assembly further includes a plurality of electrical contacts. The method comprises inserting the contacts through the contact apertures, coupling the alignment housing to the contact housing, and flexing a portion of the contacts against the alignment rib as the alignment housing is coupled to the contact housing, thereby preloading the contacts against the alignment rib in a coplanar relationship with one another.

DETAILED DESCRIPTION OF THE INVENTION

Figure 1:
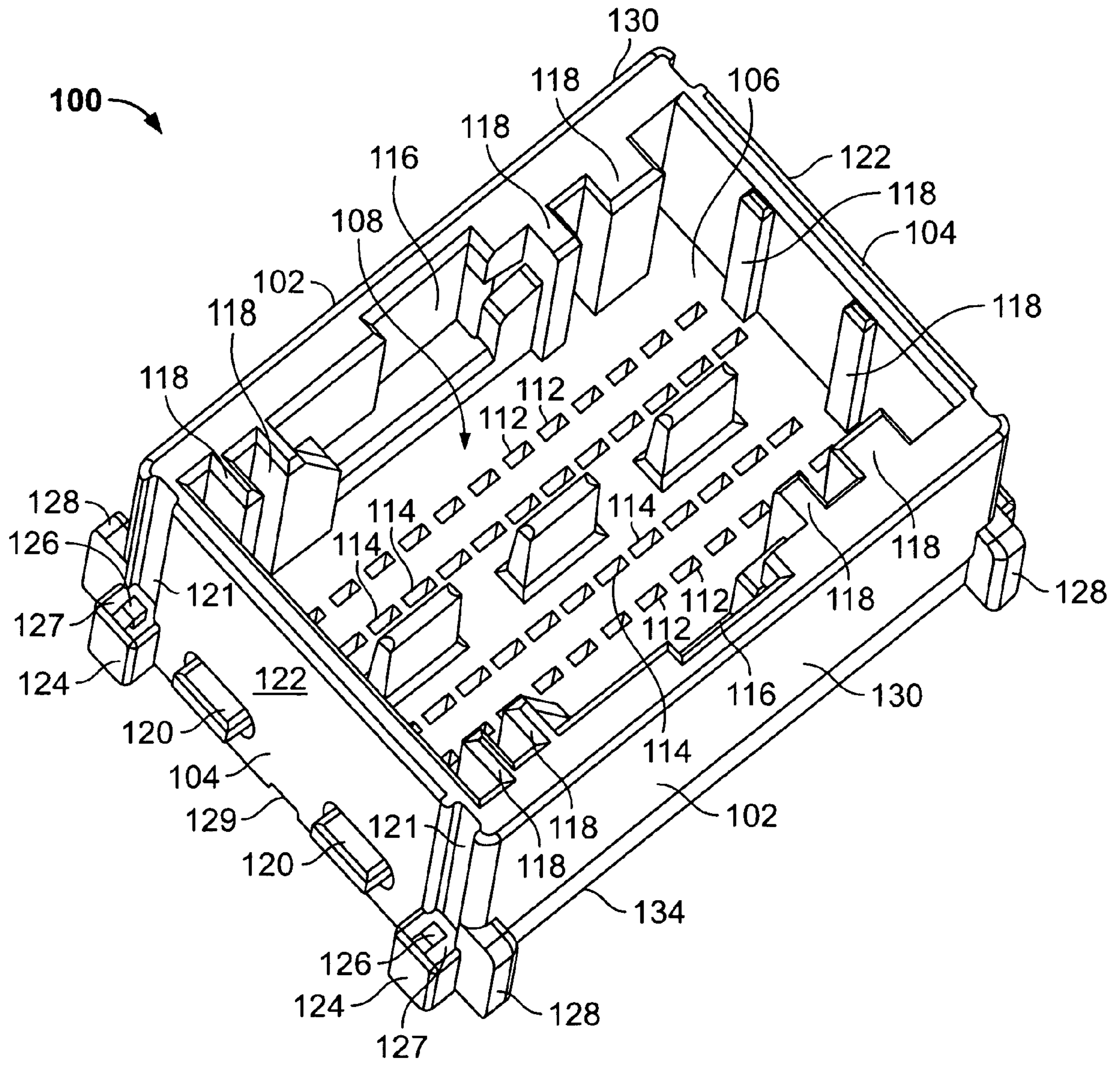
FIG. 1 is a top perspective view of a housing for a surface mount header assembly formed in accordance with an exemplary embodiment of the invention.
Figure 2:
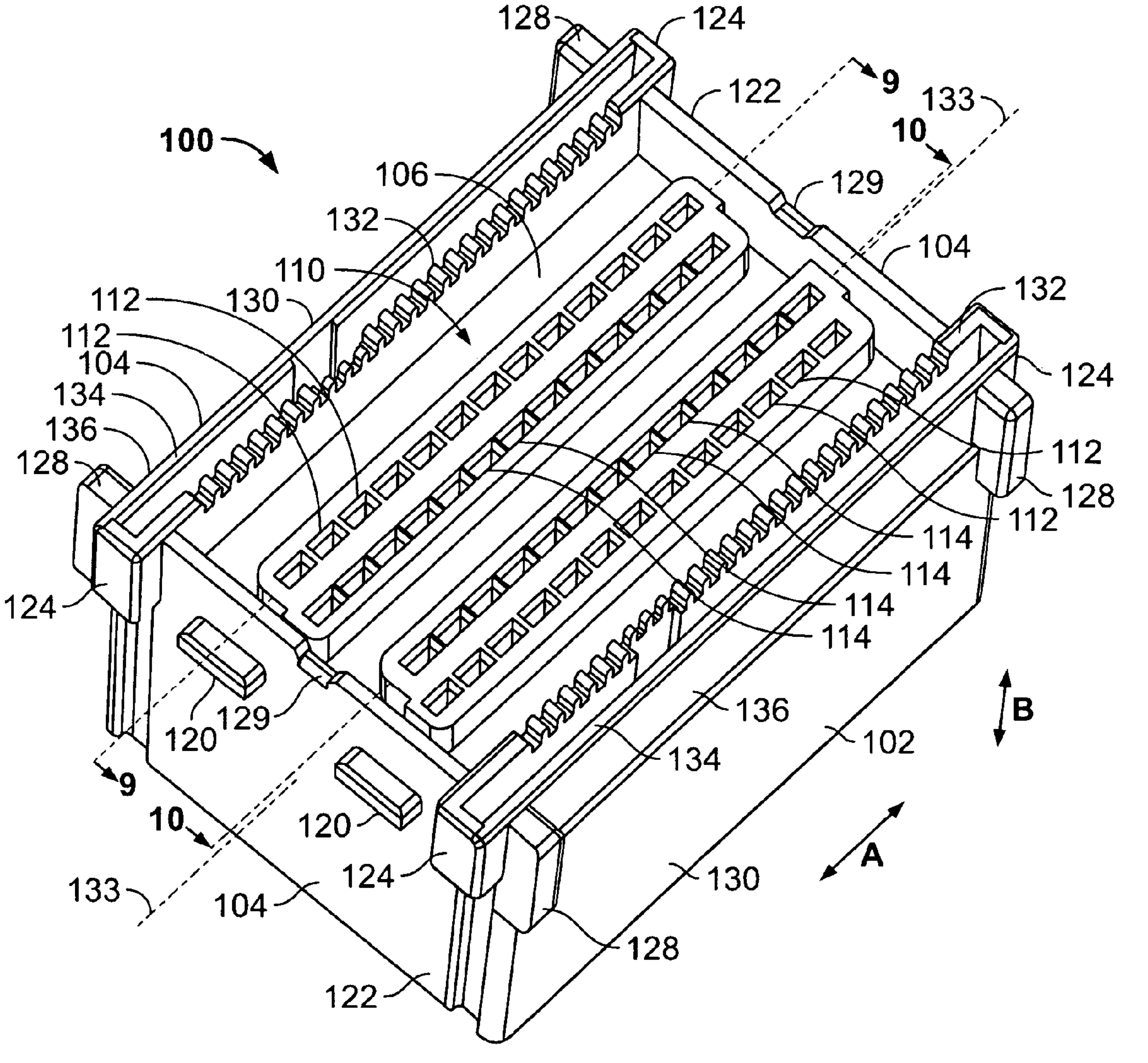
FIG. 2 is a bottom perspective view of the housing shown in FIG. 1.

FIGS. 1 and 2 are top and bottom perspective views, respectively, of a an exemplary housing 100, sometimes referred to as a shroud, for a surface mount header assembly formed in accordance with an exemplary embodiment of the invention.

The housing 100 includes a pair of longitudinal side walls 102, a pair of lateral side walls 104 extending between the ends of the longitudinal side walls 102, and a bottom wall 106 extending between the longitudinal and lateral side walls 102 and 104. The side walls 102 and 104 and the bottom wall 106 collectively define a contact cavity 108 in the top side of the housing 100 (FIG. 1), and a contact interface 110 on the bottom side of the housing 100 (FIG. 2). A first or outer row of contact apertures 112 and a second or inner row of contact apertures 114 are provided through the bottom wall 106 in a parallel relationship to each of the longitudinal side walls 102 of the housing 100, thereby providing four rows of apertures extending from the contact cavity 108 through the bottom wall 106 to the contact interface 110. In the illustrated embodiment, each of the rows of contact apertures 112 and 114 includes thirteen contact apertures, thereby providing a fifty two (13×4) position housing 100. It is recognized, however, that greater or fewer apertures may be provided in greater or fewer rows in various alternative embodiments without departing from the scope and spirit of the present invention.

Lever slots 116 are formed in each of the longitudinal side walls 102 in communication with the contact cavity 108 (FIG. 1). The lever slots 116 are configured for receiving and maintaining an actuation lever of a mating connector (not shown) for engaging electrical contacts of the mating connector with electrical contacts (described below) in the header. Various slots and keying features 118 are provided in the longitudinal side walls 102, the lateral side walls 104, and the bottom wall 106 of the housing 100 for guiding mating portions of the mating connector to align the electrical contacts of the header and the mating connector. It is understood, however, that in alternative embodiments the lever slots 116 and/or the slots and keying features 118 may be omitted in a manual (i.e., not assisted) connector assembly.

Solder clip mounting lugs 120 extend outwardly from exterior surfaces 122 of each of the lateral side walls 104 between the longitudinal side walls 102. Alignment lugs 124 are also extended outwardly from each of the exterior surfaces 122 of the lateral side walls 104 at the corners of the housing 100. Each of the alignment lugs 124 includes a biasing rib 126 (FIG. 1) on an end surface 127 thereof. As explained below, the mounting lugs 120, the alignment lugs 124 and the biasing ribs 126 serve to locate solder clips (described below) on each of the lateral side walls 104 of the housing 100 so that surfaces of the solder clips are positioned coplanar with solder tails on the contact interface 110 (FIG. 2) of the housing 100. Troughs or slots 121 may be provided around the mounting lugs 124 for collection of skived or shaved portions of the lugs 120 as the solder clips are installed. Notches 129 are provided in the bottom end of the lateral side walls 104, and the notches are employed to retain the solder clips to the lateral side walls 104 as explained below.

Optionally, and in an exemplary embodiment, lugs 128 extend outwardly from the longitudinal side walls 102 at the corners of the housing 100. The lugs 128 provide a keying feature for a mating connector on an exterior surface 130 of the longitudinal side walls 102. While the lugs 124 and 128 are illustrated as substantially rectangular in shape, it is recognized that other shapes of lugs 124 and 128 may be alternatively used in other embodiments of the invention.

Referring to FIG. 2, the contact interface 110 of the housing 100 includes a slotted positioning member 132 extending parallel to the longitudinal side walls 102, and one slot is provided in the positioning member 132 for each contact aperture in the outer row of apertures 112 and the inner row of apertures 114. When solder tails of the contacts (described below) are received in the respective slots of the positioning member 132, the solder tails are prevented from moving in the direction of arrow A which extends substantially parallel to a longitudinal axis 133 of the housing 100. The contact interface 110 further includes an alignment surface 134 extending upon an alignment rib 136 adjacent each of the longitudinal side walls 102. The alignment surfaces 134 are coplanar to one another and are laterally spaced from the positioning members 132 such that the positioning members 132 are located between the alignment surfaces and the respective outer row of contact apertures 112. As explained below, the alignment surfaces 134 provide a registration surface which ensures that ends of the solder tails on the contact interface 110 are coplanar to one another. Preloading of the solder tails against the alignment surfaces 134, as explained below, prevents the solder tails from moving in the direction of arrow B which extends perpendicular to the longitudinal axis 133.

In an exemplary embodiment, the positioning member 132, the alignment rib 136 and the alignment lugs 124 are integrally formed with one another. By forming the alignment rib 136 and the alignment lugs 124 in an integral fashion, the top surface 127 (FIG. 1) of the alignment lugs 124 are located a fixed distance from the alignment surfaces 134. As such, the solder clips may be precisely positioned with respect to the alignment surface as described below to achieve coplanarity of the solder clips with the alignment surfaces 134. Alternatively, the alignment rib 136, the positioning member 132, and the alignment lugs 124 may be separately fabricated and attached to the housing 100.

In an exemplary embodiment, the housing 100, including each of the aforementioned features, is integrally formed from an electrically insulative (i.e., nonconductive) material, such as plastic, according to a known process, such as an injection molding process. It is recognized, however, that the housing 100 may alternatively be formed of separate pieces and from other materials as those in the art may appreciate.

Figure 3:
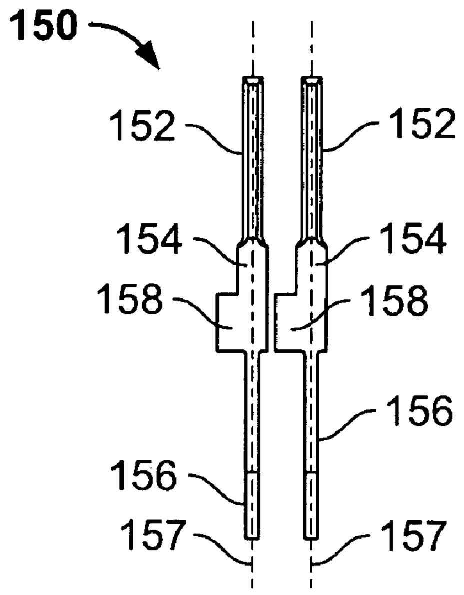
FIG. 3 is front elevational view of a first contact assembly used with the housing shown in FIGS. 1 and 2.

FIG. 3 is front elevational view of a first contact set 150 which may be employed in the outer row of contact apertures 112 (shown in FIGS. 1 and 2) of the housing 100. In an exemplary embodiment, the contact set 150 includes contact sections 152, aperture sections 154 and solder tail sections 156. The aperture sections 154 are dimensioned to produce an interference fit when inserted into an aperture in the row of contact apertures 112, and the contact sections 152 and the solder tail sections 156 are aligned with one another along a common centerline 157.

Transverse carrier strips 158 join the aperture sections 154, and when the carrier strips 158 are sheared during assembly of the header, the contact set 150 is separated into individual contacts. While only two contacts are shown in FIG. 3, it is understood that the contact set 150 includes a number of contacts corresponding to the number of contact apertures in the contact rows 112 (shown in FIGS. 1 and 2). The contact set 150 may be fabricated from a single piece of metal, such as copper or a copper alloy, and further may be coated or plated with tin, lead, gold, etc. as necessary to obtain desired electrical and mechanical characteristics and properties of the contact set 150.

Figure 4:
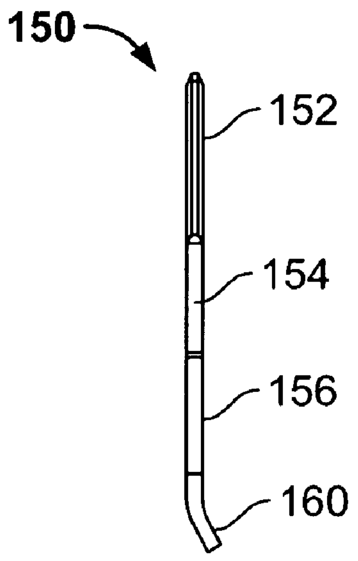
FIG. 4 is a side elevational view of the contacts shown in FIG. 3.

FIG. 4 is a side elevational view of the contact set 150 illustrating a small radius formed in an end 160 of the solder tail sections 156. The radius creates a rounded end 160 which, as will be seen below, mitigates tolerances or misalignment of the contact set 150 as the header is assembled. In an alternative embodiment, the radius may be omitted and the ends of the contact set 150 may be straight.

Figure 5:
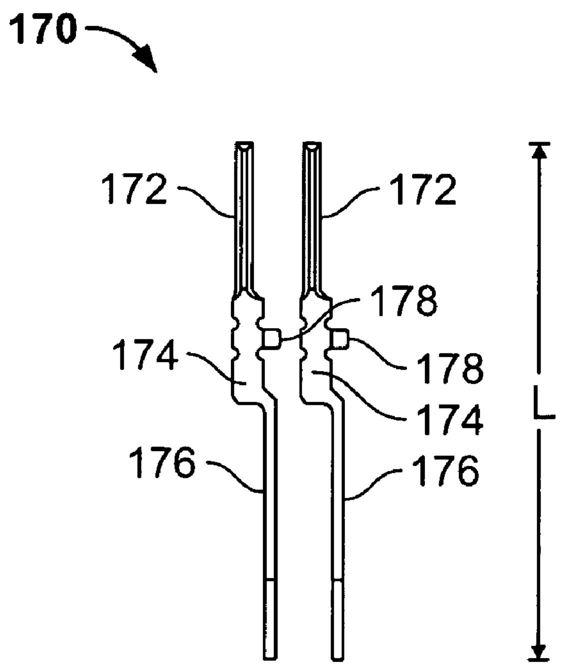
FIG. 5 is a front elevational view of a second contact assembly used with the housing shown in FIGS. 1 and 2.

FIG. 5 is a front elevational view of a second contact set 170 which may be employed in the inner row of contact apertures 114 (shown in FIGS. 1 and 2) of the housing 100. In an exemplary embodiment, the contact set 170 includes contact sections 172, aperture sections 174 and solder tail sections 176. The aperture sections 174 are shaped and dimensioned to produce an interference fit when inserted into an aperture in the row of contact apertures 114 and the contact sections 172 and the solder tail sections 176 are offset with respect to one another relative to the aperture sections 174. That is, the contact sections 172 and the solder tail sections 176 have spaced centerlines. The offset in contact sections 172 and solder tail sections 176 achieves a desired centerline spacing of the solder tail sections 176 relative to the solder tail sections 156 (shown in FIGS. 3 and 4) when the contact sets 150 and 170 are installed in the housing 100. Because the contact set 170 is installed to the inner row of contact apertures 114, the contact set 170 has a greater length L than the first contact set 150 which is installed to the outer row of contact apertures 112 in the housing 100.

Transverse carrier strips 178 join the aperture sections 174, and when the carrier strips 178 are sheared during assembly of the header, the contact set 170 is separated into individual contacts. While only two contacts are shown in FIG. 5, it is understood that the contact set 170 includes a corresponding number of contacts as there are contact apertures in the contact rows 114. The contact set 170 may be fabricated from a single piece of metal, such as copper or a copper alloy, and further may be coated or plated with tin, lead, gold, etc. as necessary to obtain desired electrical and mechanical characteristics and properties of the contact set 170.

Figure 6:
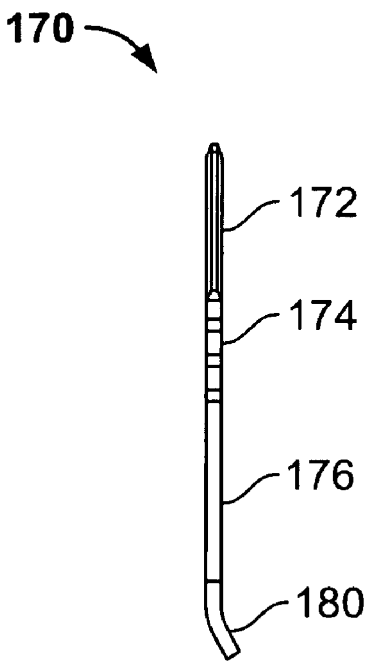
FIG. 6 is a side elevational view of the contacts shown in FIG. 5.

FIG. 6 is a side elevational view of the contact set 170 illustrating a small radius formed in an end 180 of the solder tail sections 176. The radius creates a rounded end 180 which, as will be seen below, mitigates tolerances or misalignment of the contact set 170 as the header is assembled. In an alternative embodiment, the radius may be omitted and the ends of the contact set 170 may be straight.

Figure 7:
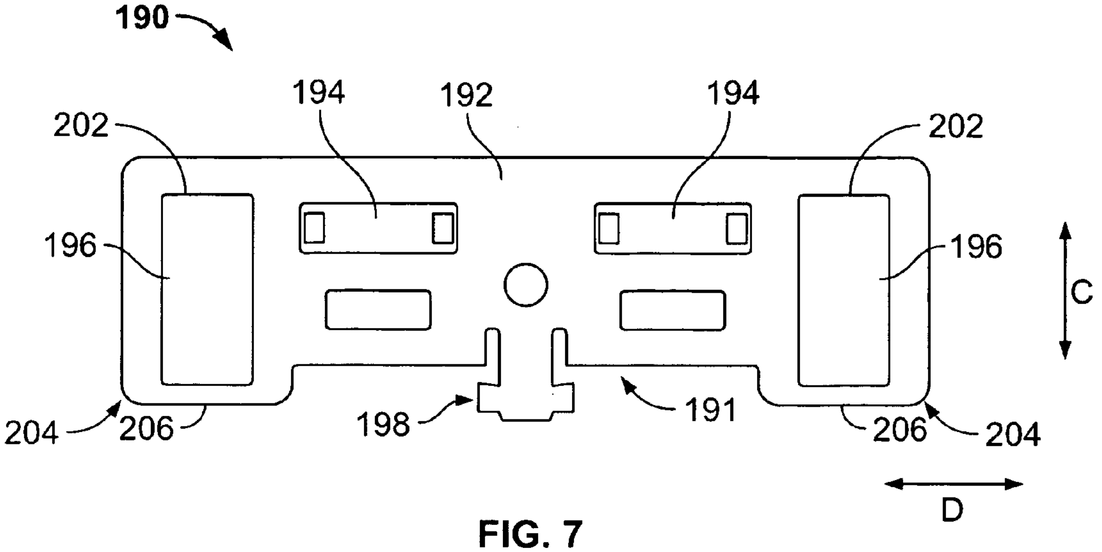
FIG. 7 is a top plan view of a solder clip formed in accordance with an exemplary embodiment of the present invention.

FIG. 7 is a top plan view of a solder clip 190 formed in accordance with an exemplary embodiment of the present invention. The clip 190 includes a main body section 192 having mounting apertures 194 and alignment apertures 196. The mounting apertures 194 are shaped and dimensioned for press fit insertion over the mounting lugs 120 of the housing 100 (shown in FIGS. 1 and 2), and the alignment apertures 196 are sized and dimensioned to receive the alignment lugs 124 (shown in FIGS. 1 and 2) of the housing 100. As such, the solder clip 190 may be aligned vertically in the direction of arrow C and horizontally in the direction of arrow D when the solder clips 190 are installed on the respective lateral walls 104 of the housing 100.

A retention tab 198 is formed on an edge 191 of the body section 192 which faces the contact interface 110 (shown in FIG. 2) of the housing 100 when the solder clip 190 is installed. The tab 198 may be folded over a lateral side wall 104 and retained in the notch 127 (shown in FIG. 2) therein. Edges 202 of the alignment apertures 196 contact the biasing ribs 126 (shown in FIG. 1) of the alignment lugs 124 of the housing 100. Assurance is therefore provided against movement of the solder clip 190 along two mutually perpendicular axes indicated by arrows C and D.

In an exemplary embodiment, the solder clip 190 is fabricated from a sheet of metal according to a stamping and forming operation. It is recognized, however, that the solder clip 190 may be fabricated from a variety of materials according to various known processes in the art in alternative embodiments.

While in an exemplary embodiment the retention tab 198 is formed in the shape of a T, it is understood that various shapes may be used in lieu of a T shape in alternative embodiments to retain the solder clip 190 to a side wall 104 of the housing 100.

Alignment tabs 204 project from the edge 191 and include solder clip board engagement surfaces 206 which are flat and smooth. The board engagement surfaces 206 contact a planar surface of a circuit board during surface mounting of the header assembly and are soldered to the circuit board. The soldering of the alignment tabs 204 provides structural strength and rigidity which provides strain relief to the soldered connections of the contact sets 150 and 170.

Figure 8:
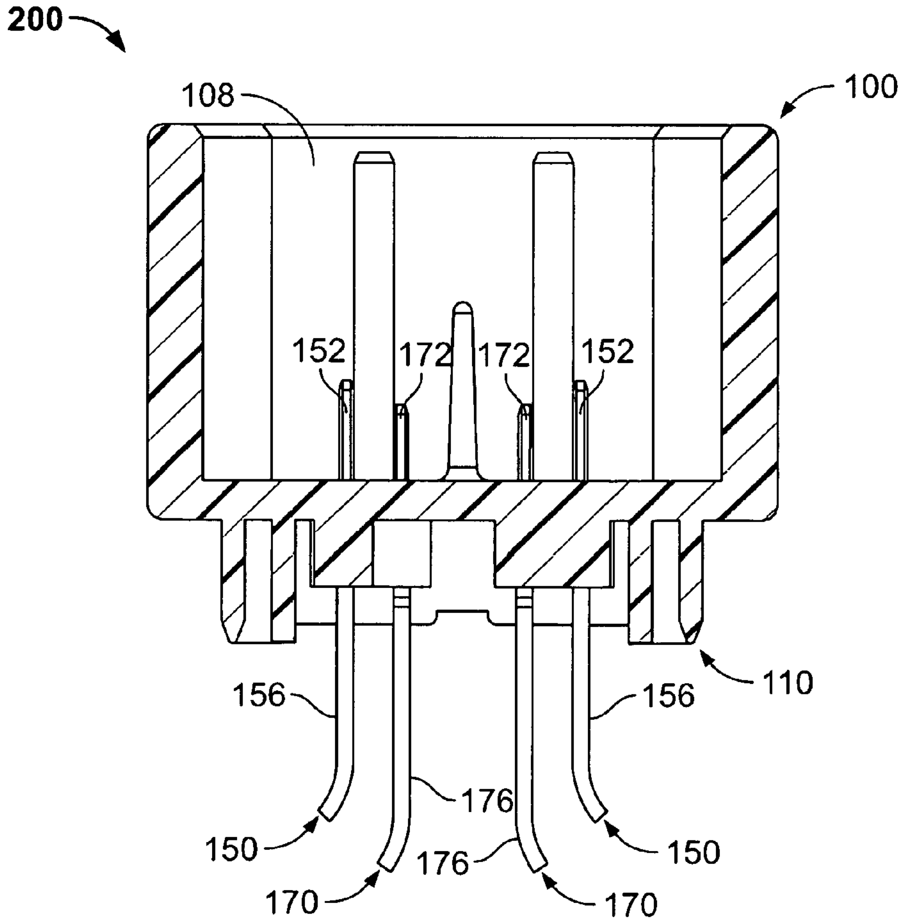
FIG. 8 is a cross sectional view of a header assembly formed in accordance with the present invention at a first stage of manufacture.

FIG. 8 is a cross sectional view of a header assembly 200 at a first stage of manufacture. The header assembly 200 includes the housing 100 with the contact sets 150 and 170 inserted into the outer and inner rows of contact apertures 112 and 114 (shown in FIGS. 1 and 2). The contact sections 152 and 172 of the respective contact sets 150 and 170 are partly located in the contact cavity 108 while the solder tail sections extend from the contact interface 110 of the housing 100.

Figure 9:
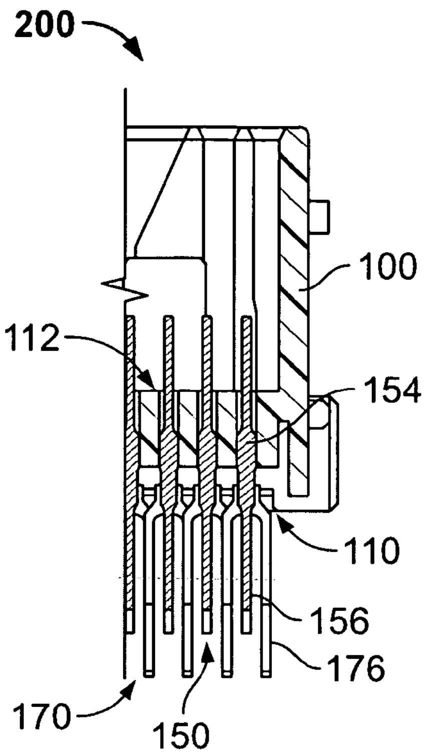
FIG. 9 is a partial cross sectional view of the header assembly shown in FIG. 8 along line 9—9 of FIG. 2.

FIG. 9 is a partial cross sectional view of the header assembly 200 through the outer row of contact apertures 112. The aperture sections 154 of the contact set 150 extend partially into the contact apertures of the row 112 for a predetermined distance, and the aperture sections 154 of the contact set 150 partly extend from the contact interface 110 of the housing 100. The carrier strips 158 (shown in FIG. 3) have been sheared from the contact set 150, thereby forming discrete contacts in the apertures in the contact aperture row 112. The solder tail sections 156 of the contact set 150 are located between the solder tail sections 176 of the contact set 170, and the centerlines of the solder tail sections 176 and 156 are consistently spaced from one another.

Figure 10:
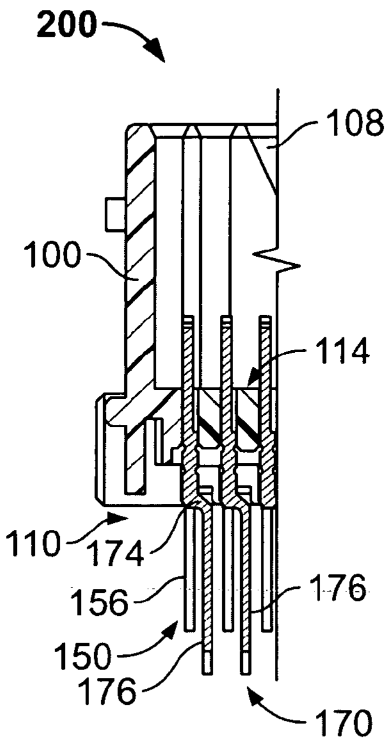
FIG. 10 is a partial cross sectional view of the header assembly shown in FIG. 8 along line 10—10 of FIG. 2.

FIG. 10 is a cross sectional view of the header assembly 200 through the inner row of contact apertures 114. The aperture sections 174 of the contact set 170 extend partially into the contact apertures of the row 114 for a predetermined distance, and the aperture sections 174 of the contact set 170 partly extend from the contact interface 110 of the housing 100. The carrier strips 178 (shown in FIG. 5) have been sheared from the contact set 170, thereby forming discrete contacts in the apertures in the contact aperture row 114. The solder tail sections 176 of the contact set 170 are located between the solder tail sections 156 of the contact set 150, and the centerlines of the solder tail sections 176 and 156 are consistently spaced from one another.

Figure 11:
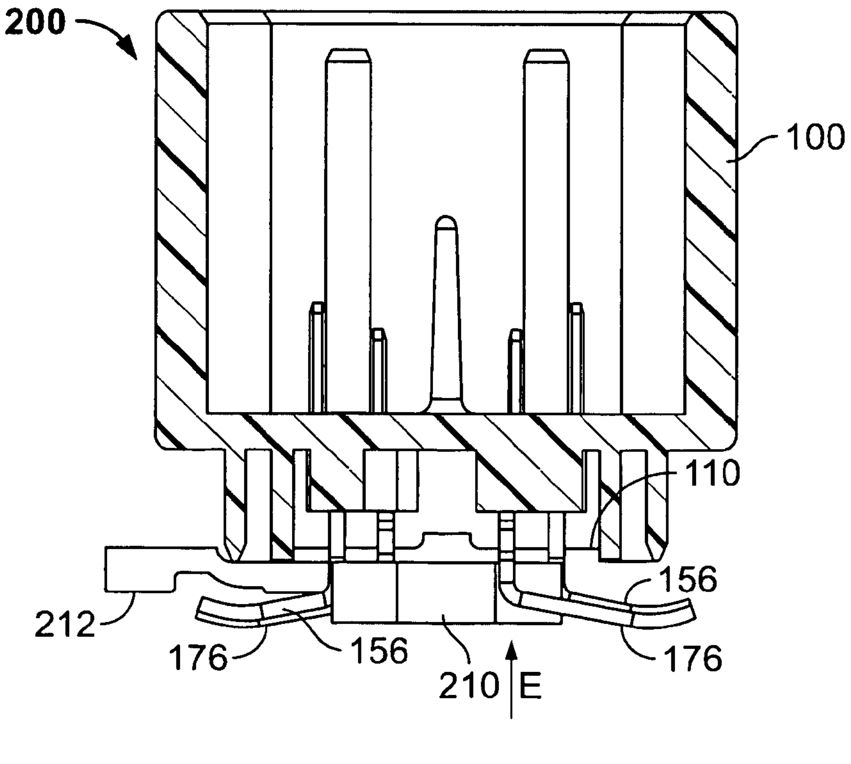
FIG. 11 is a cross sectional view of the header assembly at a second stage of manufacture.

FIG. 11 is a cross sectional view of the header assembly 200 at a second stage of manufacture wherein tooling, such as forming dies 210 and 212, is employed to bend the solder tail sections 156 and 176 toward the contact interface 110 of the housing 100. Once the forming die 212 is removed, the contacts may be further inserted through the contact interface 110 by seating the forming die 210 in the direction of arrow E to bring the bent solder tail sections 156 and 176 to the contact interface 110.

While the embodiment described thus far includes bending of the contact sets 150, 170 after they are partially installed in the housing 100, it is recognized that the contact sets 150, 170 could be bent prior to installation to the housing 100 in an alternative embodiment.

Figure 12:
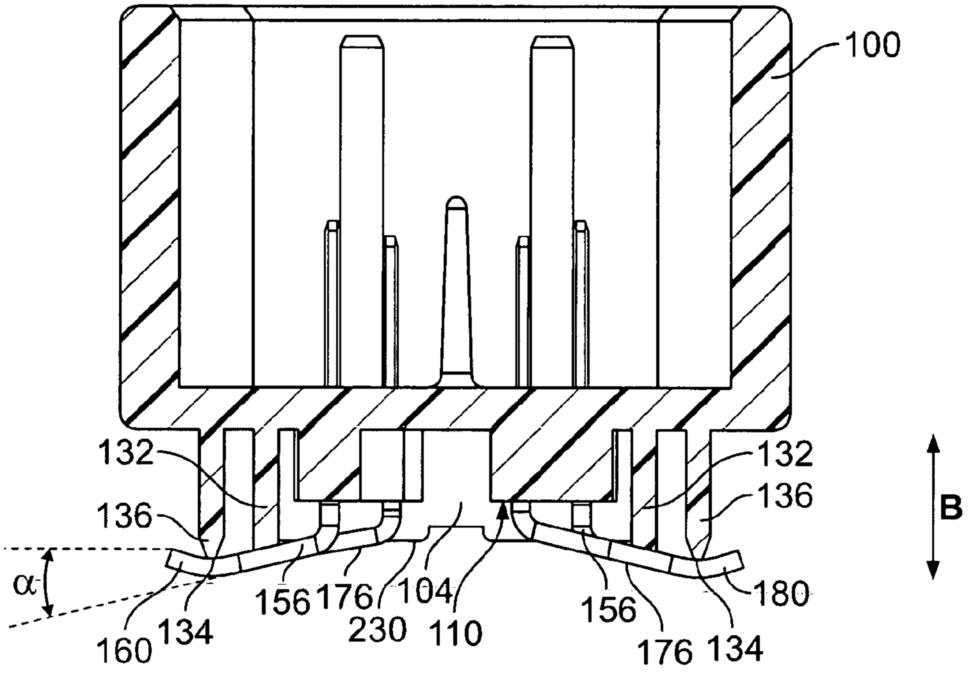
FIG. 12 is a cross sectional view of the header assembly at a third stage of manufacture.

FIG. 12 is a cross sectional view of the header assembly 200 at a third stage of manufacture wherein the aperture sections 154 and 174 (shown in FIGS. 9 and 10) are fully inserted into the respective rows of contact apertures 112 and 114 in the housing 100 to a final position. In the final position, the solder tail sections 156 and 176 are fitted through the slots in the positioning member 132 (also shown in FIG. 2), and the rounded ends 160 and 180 of the respective solder tail sections 156 and 176 are aligned with one another and in abutting contact to the alignment rib 136. As shown in FIG. 12, the alignment surface 134 is rounded or crowned and shaped to smoothly establish contact with the rounded end 160 and 180 of the contact sets 150 and 170. The solder tail sections 156 and 176 are flexed from the position shown in FIG. 11 and are obliquely oriented to the contact interface 110 of the housing 100, thereby creating in internal biasing force in the contact sets 150 and 170 which preloads the solder tail sections 156 and 176 against the alignment surfaces 134 of the alignment ribs 136. Such biasing or preloading of the solder tail sections 156 and 176 substantially prevents vertical movement of the solder tail sections 156 and 176 in the direction of arrow B as the header assembly 200 is handled prior to surface mounting and during surface mounting installation. Further, a final angle a of the solder tails 156 and 176 with respect to a top surface 230 of the lateral side walls 104 assures a satisfactory solder joint to a circuit board.

The crowned alignment surfaces 134 of the alignment ribs 136 and the rounded ends 160 and 180 of the solder tail sections 156 and 176 permits some misalignment of the solder tail sections 156 and 176 as the contact sets 150 and 170 are installed. The rounded engagement surfaces of the alignment surfaces 134 and the ends 160 and 180 of the contact sets 150 and 170 allow for shifting points of contact among the engagement surfaces as the contact sets 150 and 170 are moved to the final position. As the solder tail sections 156 and 176 are preloaded against the alignment ribs 136, relative misalignment of the solder tails is substantially, if not entirely, eliminated and the rounded ends 160 and 180 of the contact sets 150 and 170 are substantially aligned to produce coplanar contact points tangential to the rounded ends for mounting to a circuit board.

While in the illustrated embodiment the alignment surfaces 134 are crowned and the ends 160 and 180 of the contact sets 150 and 170 are rounded, it is appreciated that in an alternative embodiment the alignment surface may be substantially flat and the contact ends may be substantially straight while nonetheless aligning the contacts in a planar relationship to one another for surface mounting to a circuit board.

Figure 13:
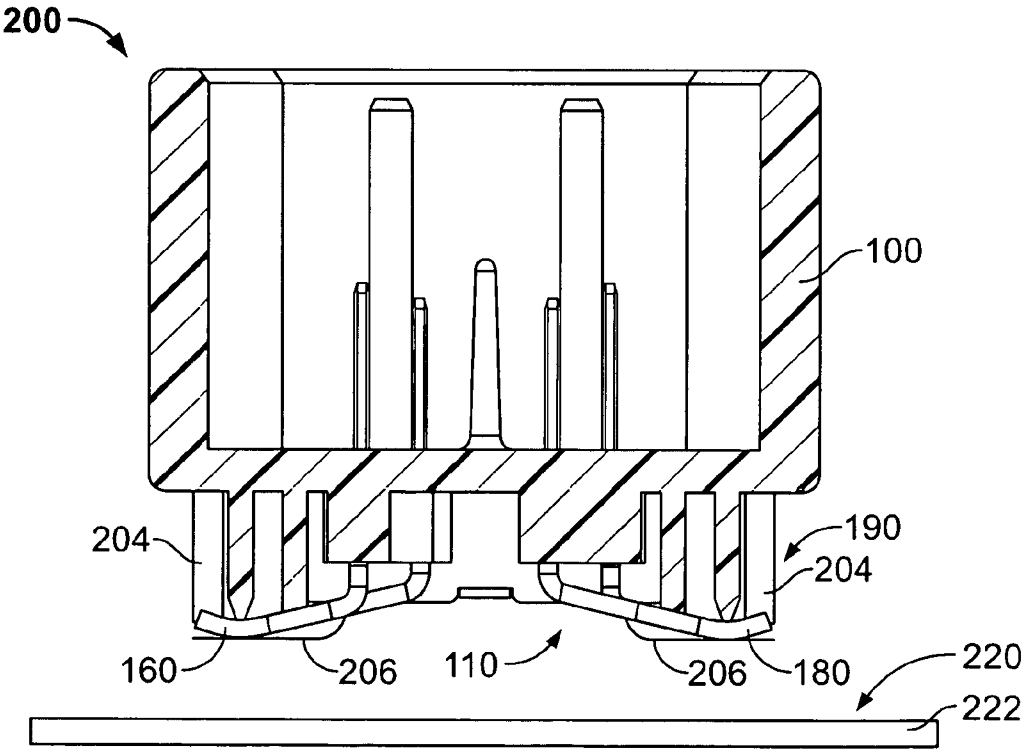
FIG. 13 is a cross sectional view of the header assembly at a final stage of manufacture.

FIG. 13 is a cross sectional view of the header assembly 200 at a final stage of manufacture wherein the solder clips 190 are attached to the housing 100. The engagement surfaces 206 of the solder clip alignment tabs 204 are coplanar with the contact ends 160, 180 of the contacts sets 150 and 170. The contact interface 110 is therefore well suited for surface mounting to a planar surface 220 of a circuit board 222.

Figure 14:
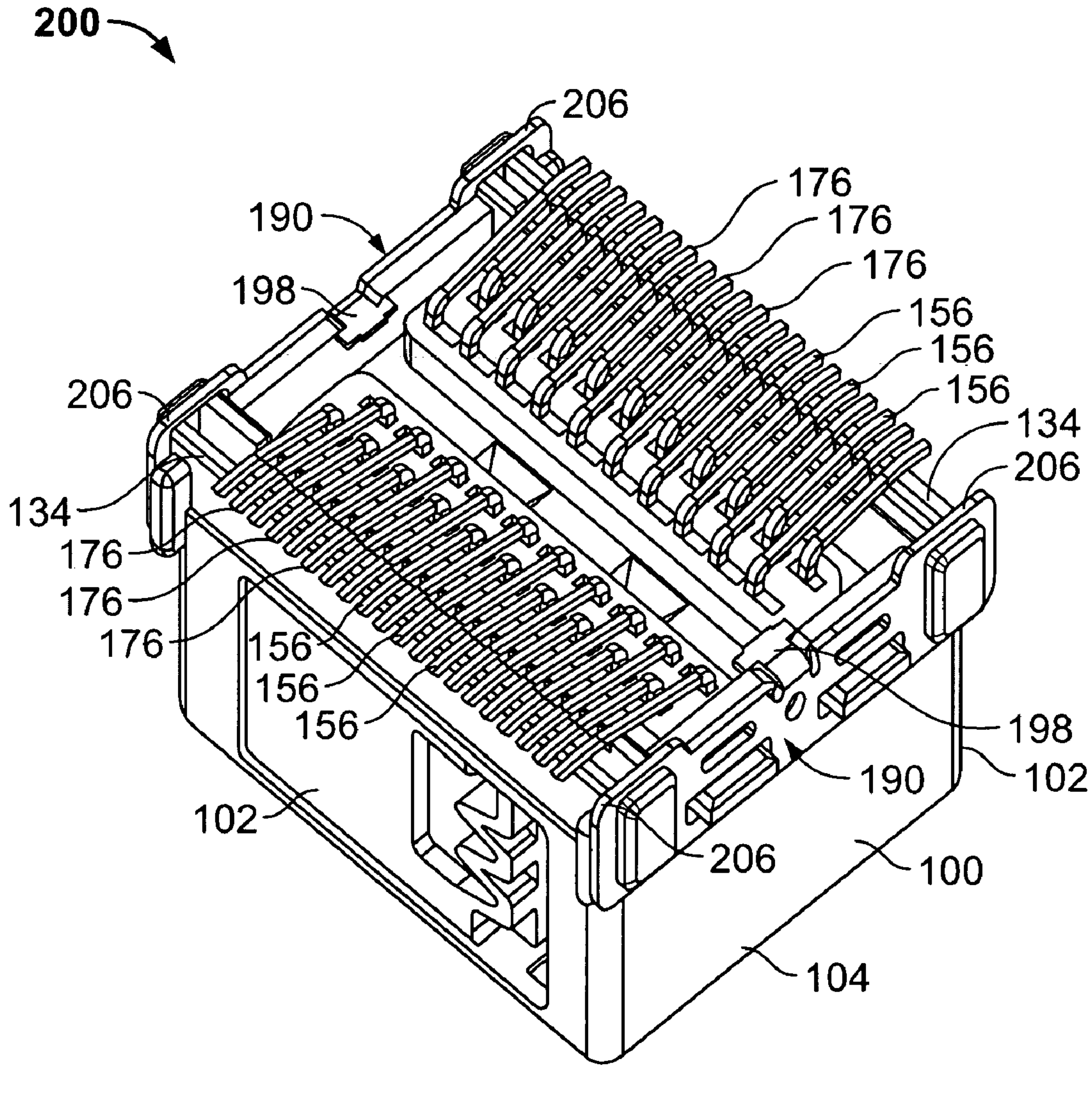
FIG. 14 is a bottom perspective view of the header assembly shown in FIG. 13.

FIG. 14 is a bottom perspective view of the header assembly 200 when completely assembled. The solder clips 190 are coupled to the lateral side walls 104 of the housing 100 and retained thereto by the retention tabs 198. The solder tail sections 156 and 176 are preloaded and abutted against the alignment surfaces 134 adjacent the longitudinal side walls of the housing 100. Manufacturing tolerances in fabricating the contact sets 150 and 170 are mitigated and the solder tail sections 156 and 176 are substantially aligned and coplanar for mounting to the planar surface 220 of the board 222 (shown in FIG. 13). The solder clip board alignment surfaces 206 are substantially aligned and coplanar with the solder tail sections 156 and 176 for secure mounting to the circuit board 222 in the plane of the solder tail sections 156 and 176. Relatively thin and consistent films of solder paste may therefore be used for reliably soldering the header assembly 200 to the circuit board 222.

For all the above reasons, a secure and reliable header assembly is provided for surface mounting applications which capably resists high insertion and extraction forces when the header assembly 200 is engaged and disengaged from a mating connector.

Figure 15:
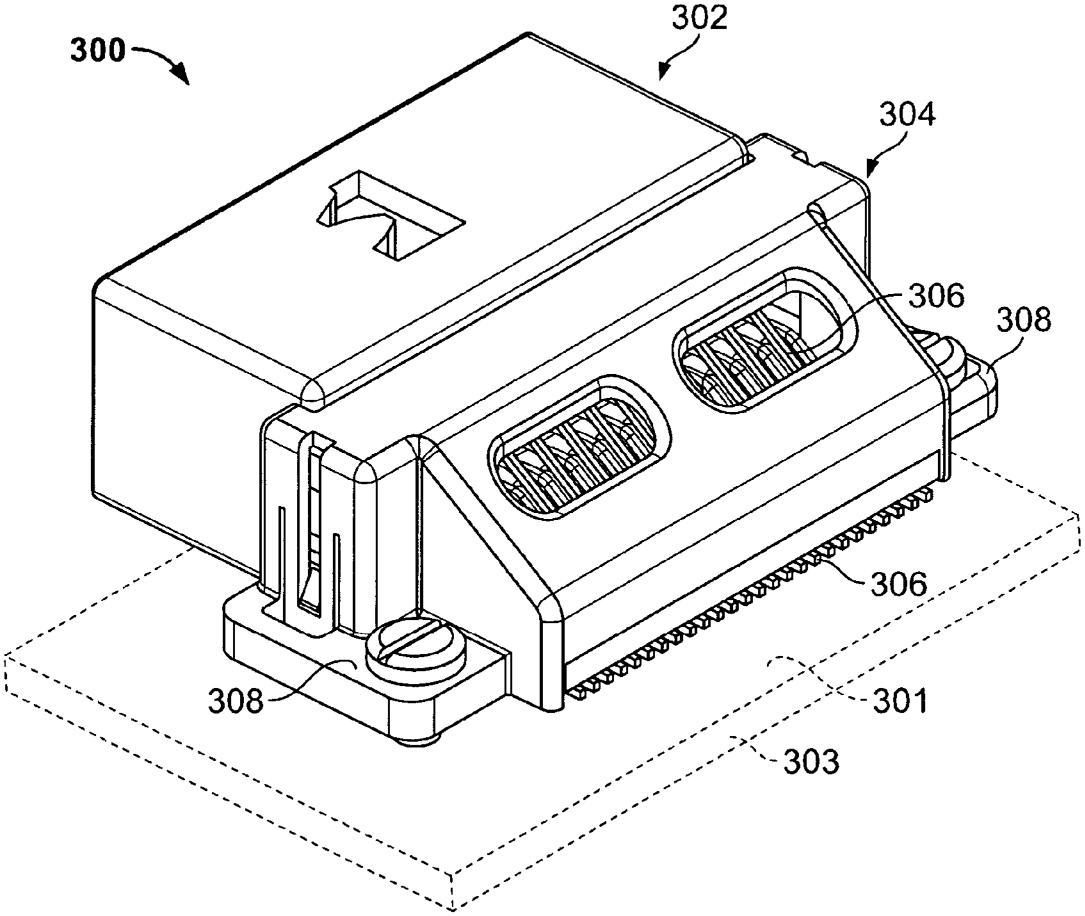
FIG. 15 is a top perspective view of an alternative surface mount header assembly formed in accordance with an alternative embodiment of the invention.

FIG. 15 is a top perspective view of an alternative surface mount header assembly 300 formed in accordance with an alternative embodiment of the present invention. In the illustrated embodiment, the header assembly 300 is a right angle surface mount header assembly and may be oriented along an engagement surface 301 of a circuit board 303 (shown in phantom in FIG. 15).

The header assembly 300 includes a contact housing or shroud 302, an alignment housing 304 attached to the housing 302, and a plurality of contacts 306 housed within and/or aligned by the contact housing 302 and the alignment housing 304, as explained in detail below. The contact housing 302 and the alignment housing 304 are distinct and separately fabricated members mounted to one another for orienting the contacts 306 with respect to the circuit board 303. In an exemplary embodiment, the contact housing 302 is a previously fabricated and known contact housing and the alignment housing 304 is fabricated to be retrofit to attach to the contact housing 302 and align the contacts as described in detail below.

The contact housing 302 and the alignment housing 304 may each be individually or collectively coupled to the circuit board 303, such that the contacts 306 engage the engagement surface 301 in a substantially planer orientation. In an exemplary embodiment, the alignment housing 304 is coupled to the contact housing 302. The alignment housing 304 includes board mount features 308 for mounting the header assembly 300 to the circuit board 303. In alternative embodiments, the alignment housing 304 includes solder clip mounting lugs (not shown), and the header assembly 300 is mounted to the circuit board 303 via solder clips (not shown). Alternatively, the contact housing 302 may include board mount features (not shown) for mounting the header assembly 300 to the circuit board 303.

Figure 16:
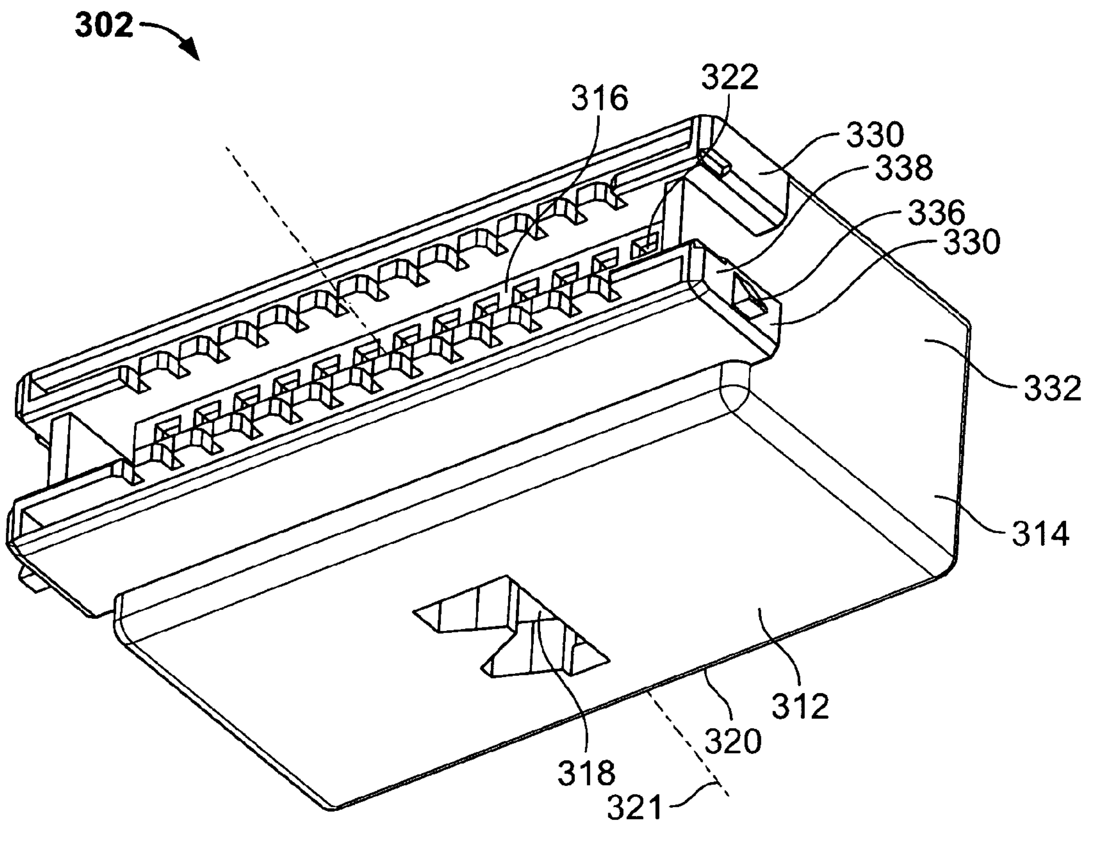
FIG. 16 is a bottom perspective view of a contact housing for the header assembly shown in FIG. 15.

FIG. 16 is a bottom perspective view of the contact housing 302. The contact housing 302 includes a pair of longitudinal side walls 312, a pair of lateral side walls 314 extending between the ends of the longitudinal side walls 312, and a contact interface 316 extending between the longitudinal and lateral side walls 312 and 314. The side walls 312 and 314 and the contact interface 316 collectively define a contact cavity 318 within the housing 302. A plug interface 320 extends between the longitudinal and lateral side walls 312 and 314 and is generally opposed from the contact interface 316. The plug interface 320 is oriented to receive a plug assembly (not shown) and includes an opening (not shown in FIG. 16) extending therethrough allowing access to the contact cavity 318. In the illustrated embodiment, one of the longitudinal side walls 312 is oriented to engage the engagement surface 301 (shown in FIG. 15) when the header assembly 300 is coupled to the circuit board 303 (shown in FIG. 15). A cavity axis 321 extends between and is substantially perpendicular to each of the contact interface 316 and the plug interface 320. In contrast to the housing 100, the cavity axis 321 of the housing 302 is oriented substantially parallel to the engagement surface 301 of the circuit board 303.

A first or upper row of contact apertures 322 and a second or lower row of contact apertures (not shown in FIG. 16) are provided through the contact interface 316 in a parallel relationship to each of the longitudinal side walls 312 of the contact housing 302. The lower row of contact apertures extends substantially parallel to and is spaced apart from the upper row of contact apertures 322. In an exemplary embodiment, each of the rows of contact apertures includes thirteen contact apertures. It is recognized, however, that greater or fewer apertures may be provided in greater or fewer rows in various alternative embodiments without departing from the scope and spirit of the present invention.

Alignment lugs 330 extend outwardly from exterior surfaces 332 of each of the lateral side walls 314 between the longitudinal side walls 312. The alignment lugs 330 are positioned proximate the contact interface 316 of the contact housing 302. Each of the alignment lugs 330 serve to locate the alignment housing 304 (shown in FIG. 15) in relation to the contact housing 302, and provide a keying feature for mating the alignment housing 304 to the contact housing 302 along one of the longitudinal side walls 312. While the alignment lugs 330 are illustrated as substantially rectangular in shape, it is recognized that other shapes of lugs 330 may be alternatively used in other embodiments of the invention.

A latch or retention clip 336 may be provided on an exterior surface 338 of the alignment lugs 330. The latches 336 serve to retain the alignment housing 304, as explained below, when the header assembly 300 is assembled.

In an exemplary embodiment, the contact housing 302, including each of the aforementioned features, is integrally formed from an electrically insulative (i.e., nonconductive) material, such as plastic, according to a known process, such as an injection molding process. It is recognized, however, that the housing 302 may alternatively be formed of separate pieces and from other materials as those in the art may appreciate.

Figure 17:
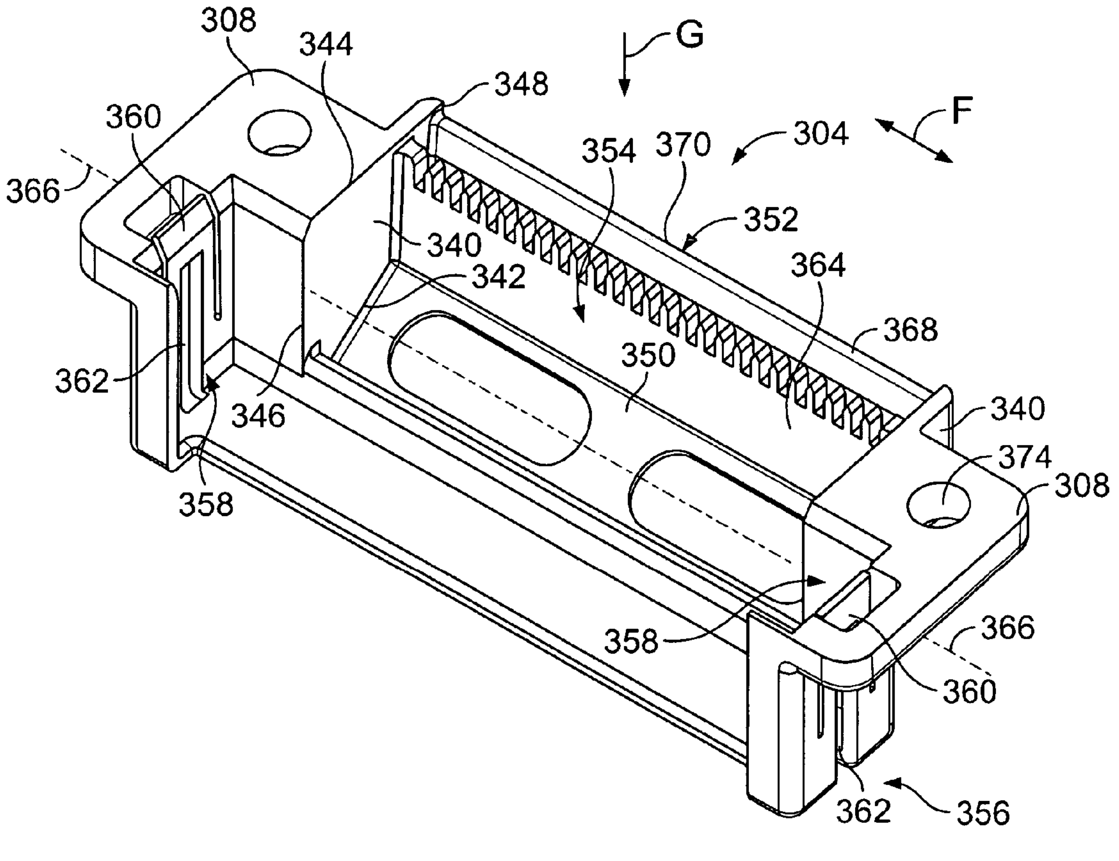
FIG. 17 is a bottom perspective view of an alignment housing for the header assembly shown in FIG. 15.

FIG. 17 is a bottom perspective view of the alignment housing 304. The alignment housing 304 includes a pair of laterally spaced side walls 340. The side walls include a top edge 342, a bottom edge 344, an inner side edge 346 and an outer side edge 348. In the illustrated embodiment, the top edge of each side wall 340 is sloped between the inner and outer side edges 346 and 348. A longitudinal wall 350 extends between the top edges 342 of the lateral side walls 340. An alignment member 352 extends between the lateral side walls 340 and is positioned proximate the outer side edge 348 of each side wall 340. The side walls 340, the longitudinal wall 350, and the alignment member 352 collectively define an alignment cavity 354 within the housing 304. As explained below in detail, the contacts 306 (shown in FIG. 15) are aligned within the alignment cavity 354 for surface engagement with the circuit board 303 (shown in FIG. 15).

The alignment housing 304 also includes a contact housing mount 356 extending from the inner side edge 346 of each lateral side walls 340. The housing mount 356 includes an opening extending between the inner side edges 346 of the lateral side walls 340 to allow access from the contact housing 302 (shown in FIG. 16) to the alignment cavity 354. Specifically, when the header assembly 300 is assembled, the contact interface 316 (shown in FIG. 16) of the contact housing 302 is oriented within the opening, thereby allowing the contacts 306 to extend into the alignment cavity 348. The housing mount 356 also includes a pair of mounting cavities 358 extending outwardly from the opening. The mounting cavities 358 are sized and shaped to engage the alignment lugs 330 (shown in FIG. 16) extending from the lateral side walls 314 (shown in FIG. 16) of the contact housing 302.

The housing mount 356 includes retention tabs 360 positioned proximate each mounting cavity 358. The retention tabs 360 include notches or slots 362 therein for engaging the latches 336 (shown in FIG. 16) extending from the alignment lugs 330. Accordingly, the retention tabs 360 secure the alignment housing 304 to the contact housing 302. Moreover, the retention tab 360 is moveable such that the latches 336 may be released, and the header assembly 300 may be disassembled. Specifically, a force may be applied to the retention tabs 360 in a generally outward direction with respect to the mounting cavities 358 until the latches 336 are no longer retained within the slots 362, and the alignment housing 304 may be disengaged from the contact housing 302.

The alignment member 352 is spaced from the opening extending between the inner side edges 346 of the side walls 340. The alignment member 352 includes a slotted positioning member 364 extending substantially parallel to the opening, and one slot is provided in the positioning member 364 for each contact aperture in the contact interface 316. As described below, when the contacts 306 are received in the respective slots of the positioning member 364, the contacts 306 are prevented from moving in the direction of arrow F which extends substantially parallel to a longitudinal axis 366 of the alignment housing 304.

The alignment member 352 further includes an alignment surface 368 extending upon an alignment rib 370 adjacent the outer edge 348 of each side wall 340. The alignment surface 368 is planar and extends substantially parallel to the engagement surface 301 (shown in FIG. 15) when the alignment housing 304 is mounted to the circuit board 303. Moreover, the alignment surface 368 is in a spaced apart relationship with the engagement surface 301 when the header assembly 300 is mounted to the circuit board 303 such that the contacts 306 may extend between the alignment surface 368 and the engagement surface 301. The alignment rib 370 and the alignment surface 368 are laterally spaced from the positioning member 364 such that the positioning member 364 is located between the alignment surface 368 and the opening extending between the inner side edges 346 of the side walls 340. As explained below, the alignment surface 368 provides a registration surface which ensures that ends of the contacts 306 are coplanar to one another. Preloading of the contacts 306 against the alignment surface 368, as explained below, prevents the contacts 306 from moving in the direction of arrow G which extends perpendicular to the longitudinal axis 366.

In an exemplary embodiment, the board mount features 308 extend outwardly from each of the lateral side walls 340 adjacent the bottom edges 344 thereof. In the illustrated embodiment, the board mount features 308 include fastening bores 374 for receiving fasteners (not shown) therein. The fasteners serve to mount the alignment housing 304 to the circuit board 303. In an alternative embodiment, solder clip mounting lugs may extend outwardly from the side walls 340 to locate and/or retain solder clips thereon for mounting the alignment housing 304 in position with respect to the circuit board 303. The board mount features 308 may be precisely positioned with respect to the alignment surface 368 as described below to achieve coplanarity of the contacts 306 with the alignment surface 368.

In an exemplary embodiment, the alignment housing 304, including each of the aforementioned features, is integrally formed from an electrically insulative (i.e., nonconductive material), such as plastic, according to a known process, such as an injection molding process. It is recognized, however, that the housing 304 may alternatively be formed of separate pieces and from other materials as those in the art may appreciate.

Figure 18:
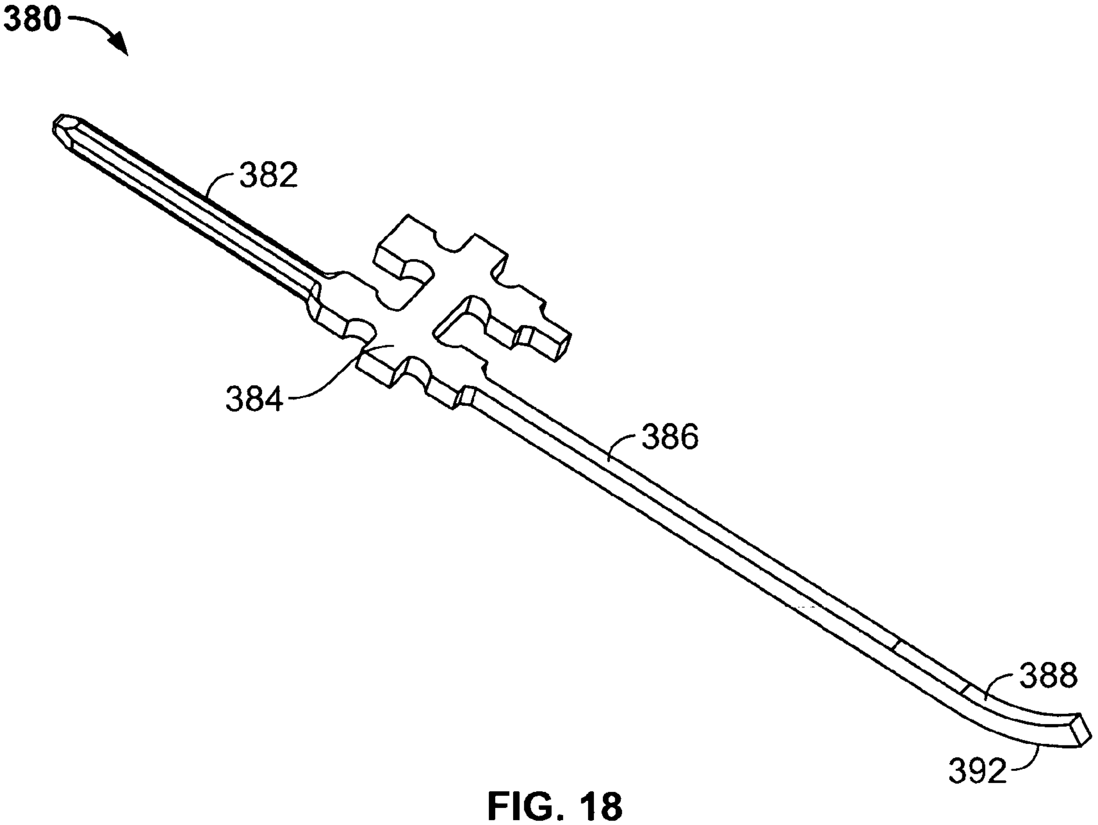
FIG. 18 is a front elevational view of a first contact assembly used with the header assembly shown in FIG. 15.

FIG. 18 is a side elevational view of a first contact 380 which may be employed in the upper row of contact apertures 322 (shown in FIG. 16) of the contact housing 302 (shown in FIGS. 15 and 16). In an exemplary embodiment, the contact 380 includes a contact section 382, an aperture section 384, a forming section 386, and a solder tail section 388. The forming section 386 may be bent and/or manipulated during assembly of the header assembly to substantially orient the contact in position relative to the contact housing 302 and/or the alignment housing 304 (shown in FIGS. 15 and 17). The aperture section 384 is dimensioned to produce an interference fit when inserted into an aperture in the upper row of contact apertures 322, and the contact section 382 and the forming section 386 are aligned with one another along a common centerline. A small radius is formed in an end 392 of the solder tail sections 388. The radius creates a rounded end 392 which, as will be seen below, mitigates tolerances or misalignment of the contact 380 as the header assembly 300 is assembled. In an alternative embodiment, the radius may be omitted and the ends of the contact 380 may be straight.

While a single contact 380 is shown in FIG. 18, it is understood that the contact 380 is part of a contact set including a number of contacts corresponding to the number of contact apertures in the contact rows 322 (shown in FIG. 17). The contact set may be fabricated from a single piece of metal, such as copper or a copper alloy, and further may be coated or plated with tin, lead, gold, etc. as necessary to obtain desired electrical and mechanical characteristics and properties of the contact set.

Figure 19:
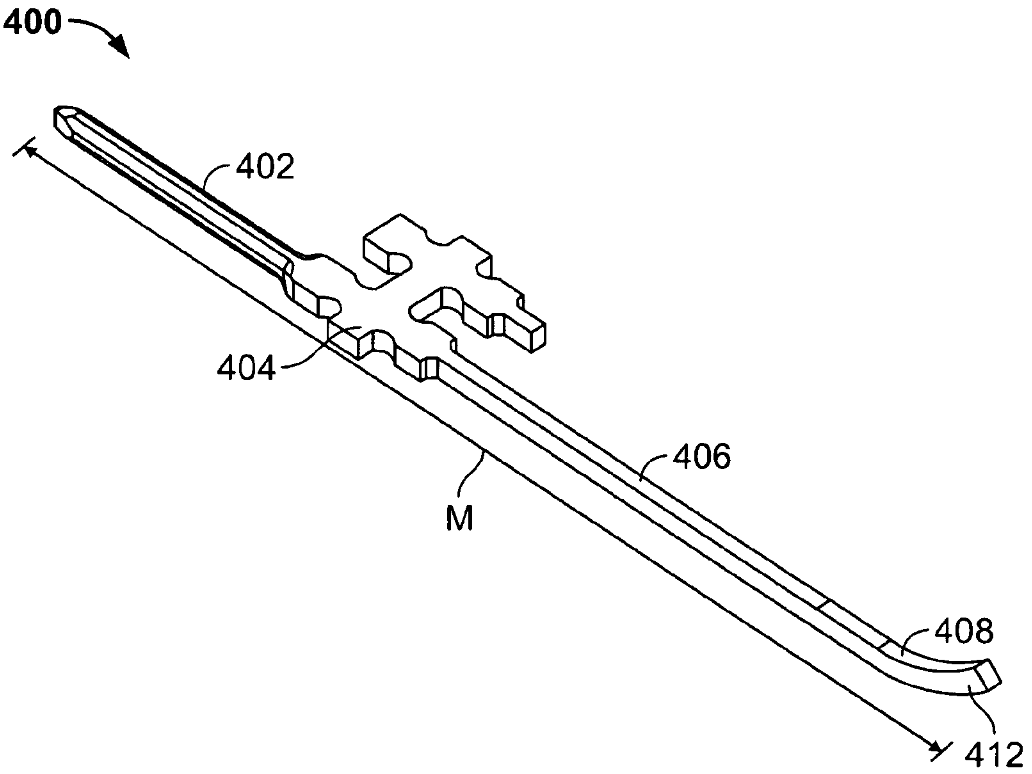
FIG. 19 is a front elevational view of a second contact assembly used with the header assembly shown in FIG. 15.

FIG. 19 is a side elevational view of a second contact 400 which may be employed in the lower row of contact apertures of the contact housing 302 (shown in FIGS. 15 and 16). In an exemplary embodiment, the contact 400 includes a contact section 402, an aperture section 404, a forming section 406, and a solder tail section 408. The forming section 406 may be bent and/or manipulated during assembly of the header assembly to substantially orient the contact in position relative to the contact housing 302 and/or the alignment housing 304 (shown in FIGS. 15 and 17). The aperture section 404 is shaped and dimensioned to produce an interference fit when inserted into an aperture in the row of contact apertures, and the contact section 402 and the forming section 406 are aligned with one another along a common centerline. In an alternative embodiment, the second contacts 400 may be offset in a similar manner as the second contacts 170 shown in FIG. 5. Because the contact 400 is installed to the lower row of contact apertures, the contact 400 is relatively closer to the alignment rib 370 (shown in FIG. 17) when the header assembly 300 is assembled. Thus, the second contact 400 has a shorter length M than the first contact 380 which is installed to the upper row of contact apertures 322 in the contact housing 302.

A small radius is formed in an end 412 of the solder tail sections 408. The radius creates a rounded end 412 which, as will be seen below, mitigates tolerances or misalignment of the contact 400 as the header assembly 300 is assembled. In an alternative embodiment, the radius may be omitted and the ends of the contact 400 may be straight.

While a single contact is shown in FIG. 18, it is understood that the contact 400 is part of a contact set including a corresponding number of contacts as there are contact apertures in the contact rows. The contact set may be fabricated from a single piece of metal, such as copper or a copper alloy, and further may be coated or plated with tin, lead, gold, etc. as necessary to obtain desired electrical and mechanical characteristics and properties of the contact set.

Figure 20:
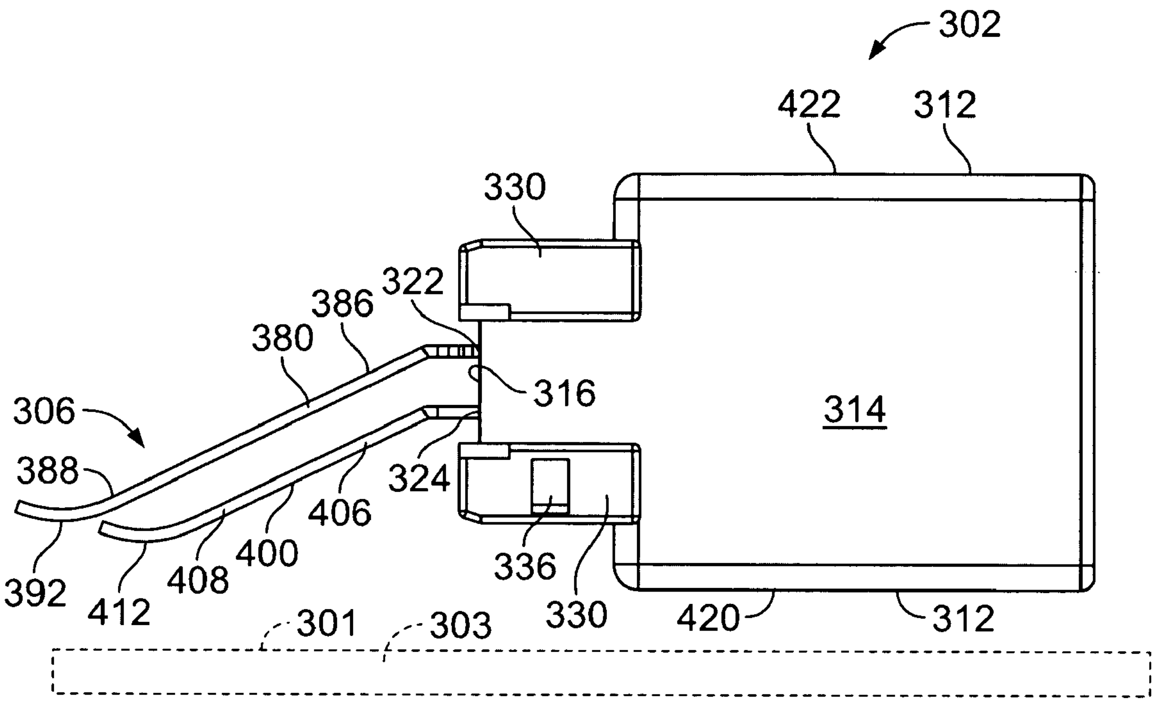
FIG. 20 is a side elevational view of the contact housing and contact assemblies formed in accordance with an alternative embodiment of the present invention at a first stage of manufacture.

FIG. 20 is a side elevational view of the contact housing 302 and contacts 380 and 400 at a first stage of manufacture, wherein the contacts 380 and 400 are inserted into the upper row of contact apertures 322 and the lower row of contact apertures (as described above and illustrated in FIG. 20 by reference numeral 324). Specifically, the contacts 380 and 400 are inserted into the apertures 322 and 324 such that the forming sections 386 and 406 and the solder tail sections 388 and 408 extend from and are located exterior to the contact interface 316 of the contact housing 302. Additionally, and in contrast to the method of forming the header assembly 200 shown in FIGS. 8–14, the contacts 380 and 400 are fully inserted prior to bending, thus eliminating an assembly step.

In the illustrated embodiment, the contact housing 302 is oriented with respect to the engagement surface 301 of the circuit board 303. As such, the longitudinal side walls 312 of the contact housing 302 define a bottom surface 420 located proximate the circuit board and a generally opposing top surface 422. The contacts 380 and 400 are oriented within the contact housing 302 such that the rounded ends 392 and 412 are upwardly curved in the direction of the top surface 422. Moreover, the rounded ends 392 and 412 are oriented to engage the alignment housing 304 (shown in FIGS. 15 and 17) when the header assembly 300 is assembled.

The alignment lugs 330 extend outwardly from the lateral side wall 314 and are positioned proximate the contact interface 316 of the contact housing 302. In an exemplary embodiment, the alignment lugs 330 are in a vertically stacked configuration above the circuit board 303 and provide a keying feature for mating the alignment housing 304 (shown in FIGS. 15 and 17) to the contact housing 302. The latch 336 extends outwardly from the alignment lug 330 positioned proximate the bottom surface 420.

In an exemplary embodiment, tooling, such as forming dies may be employed to bend the forming sections 386 and 406 and/or the solder tail sections 388 and 408 toward the bottom surface 420 of the contact housing 302. In an exemplary embodiment, and in contrast to the contact sets 150 and 170 wherein the contacts are bent at an angle of approximately 90°, the contacts 380 and 400 are bent at an angle of between approximately 15° and 45°. In one embodiment, the contacts are bent at an angle of approximately 30°. As such, the contacts 380 and 400 may be assembled or formed more quickly as compared to the contact sets 150 and 170. While the embodiment described thus far includes bending of the contacts 380 and 400 after they are installed in the contact housing 302, it is recognized that the contacts 380 and 400 could be bent prior to installation to the contact housing 302 in an alternative embodiment.

Figure 21:
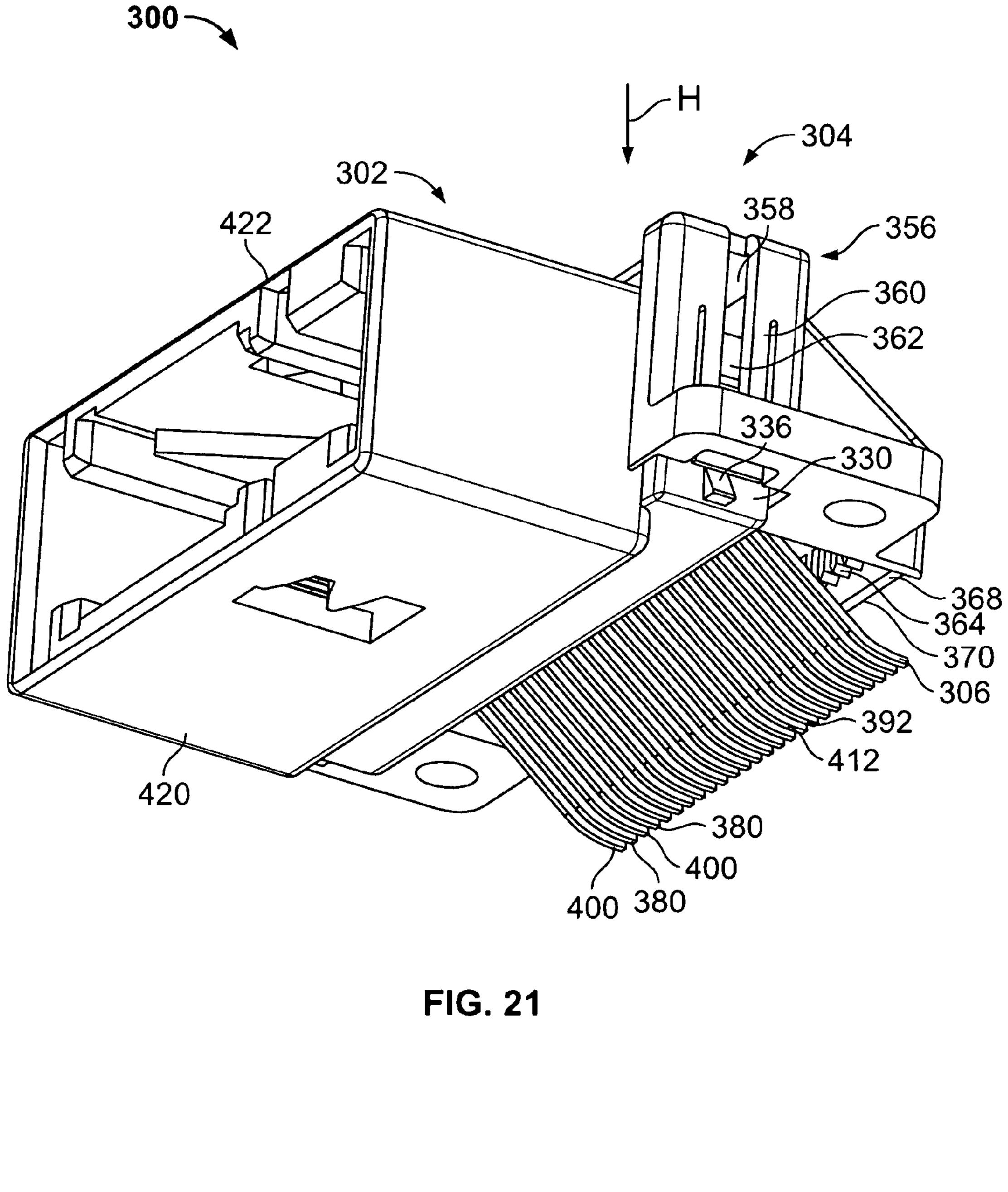
FIG. 21 is a bottom perspective view of the header assembly shown in FIG. 15 at a second stage of manufacture.

FIG. 21 is a bottom perspective view of the header assembly 300 in a second stage of manufacture, wherein the alignment housing 304 is mounted to the contact housing 302. During assembly, the contact housing mount 356 is positioned with respect to the alignment lugs 330 and the alignment housing 304 is mounted or installed onto the contact housing 302. Specifically, the contact housing mount 356 is aligned with the alignment lugs 330 generally above the top surface 422 of the contact housing 302 and is moved in a generally vertically downward direction towards the bottom surface 420 of the contact housing 302, or in the direction of arrow H. At least one advantage to having a two piece header assembly 300 is that the contacts 380 and 400 may be installed and oriented with respect to the contact housing 302 without interfering with the alignment housing 304 and/or the alignment rib 370. Specifically, only after the contacts 380 and 400 are positioned, is the alignment housing 304 mounted to the contact housing 302.

Once assembled, the alignment lugs 330 are positioned within and engage the inner surface of the mounting cavities 358. In an exemplary embodiment, the alignment lugs 330 have an interference fit with the mounting cavities 358 such that the alignment housing 304 is securely mounted to the contact housing 302. Moreover, the notches 362 within the retention tabs 360 are positioned to engage the latches 336 extending from the alignment lugs 330. Accordingly, the retention tabs 360 may secure the alignment housing 304 to the contact housing 302.

During assembly, the contacts 380 and 400 are oriented generally vertically below the alignment rib 370 and the positioning member 364. As such, when the alignment housing 304 is mounted to the contact housing 302, the alignment rib 370 engages the contacts 380 and 400. Moreover, the solder tail sections 388 and 408 are fitted through the slots in the positioning member 364, and the rounded ends 392 and 412 of the respective solder tail sections 388 and 408 are aligned with one another and in abutting contact to the alignment rib 370. As shown in FIG. 21, the alignment surface 368 is rounded or crowned and shaped to smoothly establish contact with the rounded ends 392 and 412 of the contacts 380 and 400. When installed, the solder tail sections 388 and 408 are flexed from the position shown in FIGS. 20 and 21 in a generally vertically downward direction toward the bottom surface of the contact housing 302, thereby creating an internal biasing force in the contacts 380 and 400 which preloads the solder tail sections 388 and 408 against the alignment surface 368 of the alignment rib 370.

Figure 22:
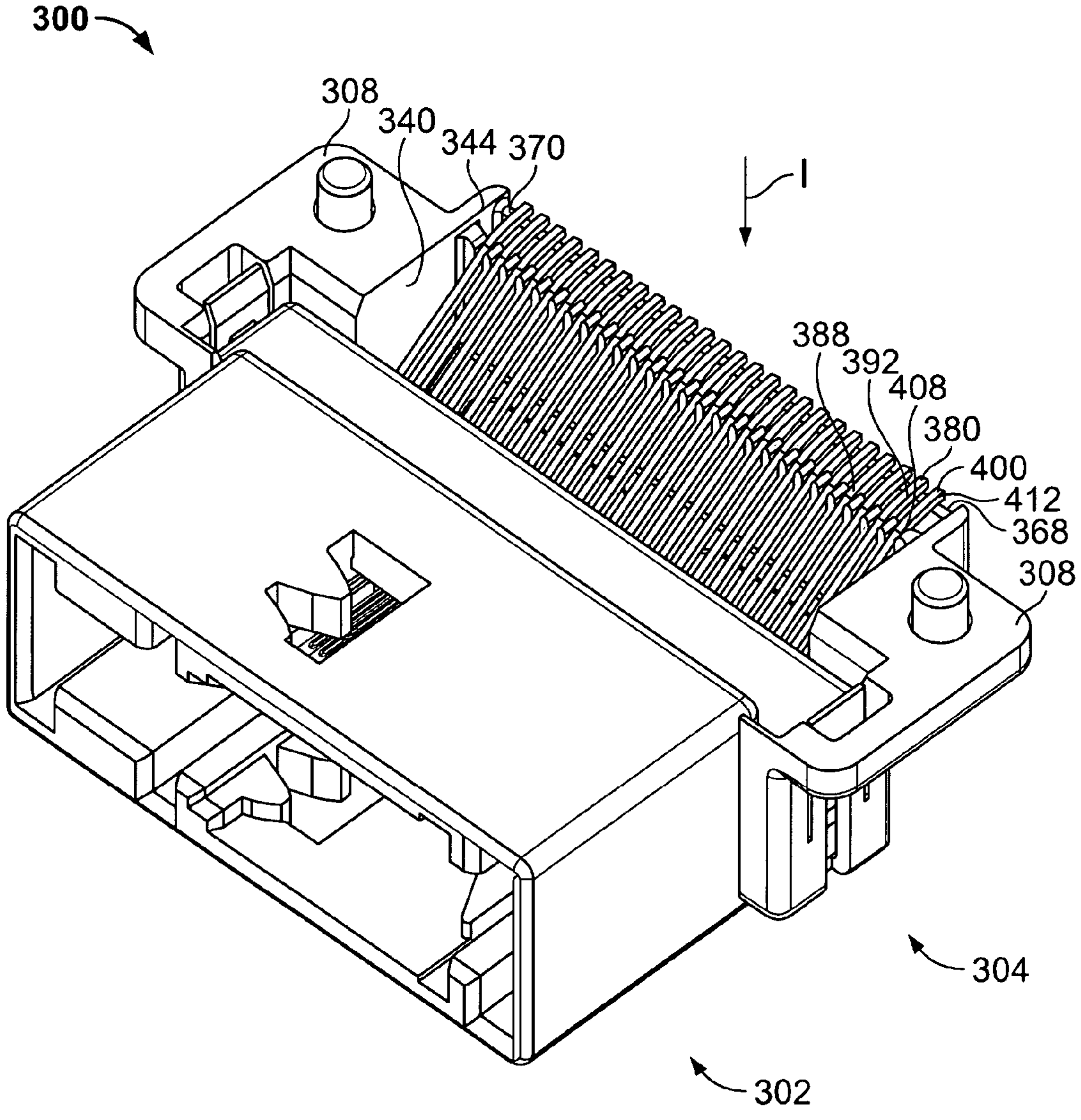
FIG. 22 is a bottom perspective view of the header assembly shown in FIG. 15 at a final stage of manufacture.

FIG. 22 is a bottom perspective view of the header assembly 300 in a final stage of manufacture, wherein the contacts 380 and 400 are substantially aligned along the alignment rib 370. In the illustrated embodiment, the alignment housing 304 is fully seated against and secured to the contact housing 302. When assembled, the bottom edges 344 of the lateral side walls 340 and the bottom surface of board mount features 308 are coplanar with the contact ends 392 and 412 of the contacts 380 and 400. The header assembly 300 is therefore well suited for surface mounting to the engagement surface 301 of the circuit board 303 (shown in FIG. 15).

When assembled, the solder tail sections 388 and 408 are preloaded and abutted against the alignment surface 368 of the alignment rib 370 at a corner of the header assembly 300. Such biasing or preloading of the solder tail sections 388 and 408 substantially prevents vertical movement of the solder tail sections 388 and 408 in the direction of arrow I as the header assembly 300 is handled prior to surface mounting and during surface mounting installation. Manufacturing tolerances in fabricating the contacts 380 and 400 are mitigated and the solder tail sections 388 and 408 are substantially aligned and coplanar for mounting to the circuit board 303. Relatively thin and consistent films of solder paste may therefore be used for reliably soldering the header assembly 300 to the circuit board 303.

In an exemplary embodiment, the crowned alignment surface 368 of the alignment rib 370 and the rounded ends 392 and 412 of the solder tail sections 388 and 408 permits some misalignment of the solder tail sections 388 and 408 as the contacts 380 and 400 are installed. The rounded alignment surfaces 368 and the ends 392 and 412 of the contacts 380 and 400 allow for shifting points of contact among the surfaces as the contacts 380 and 400 are moved to the final position. As the solder tail sections 388 and 408 are preloaded against the alignment rib 370, relative misalignment of the solder tail sections 388 and 408 is substantially, if not entirely, eliminated and the rounded ends 392 and 412 of the contacts 380 and 400 are substantially aligned to produce coplanar contact points tangential to the rounded ends 392 and 412 for mounting to the circuit board 303.

For all the above reasons, a secure and reliable header assembly 300 is provided for surface mounting applications which capably resists high insertion and extraction forces when the header assembly 300 is engaged and disengaged from a mating connector. The header assembly 300 includes a contact housing 302 and an alignment housing 304 mounted to the contact housing. During assembly, contacts 380 and 400 are loaded into the contact housing 302 and aligned for engagement with the alignment housing 304. Optionally, an existing contact housing 302 may be utilized and retrofit for this particular application. As a result, manufacturing and development costs may be reduced. Additionally, as the alignment housing 304 is installed onto the contact housing 302, an alignment rib 370 engages rounded ends 392 and 412 of the contacts 380 and 400. Once fully assembled, the alignment rib 370 substantially aligns the contacts 380 and 400 to produce coplanar contact points for surface engagement with a circuit board 303. As a result, a cost effective and reliable header assembly 300 is provided that ensures coplanarity of the contacts 380 and 400 for surface mounting to the circuit board 303.

While the invention has been described in terms of various specific embodiments, those skilled in the art will recognize that the invention can be practiced with modification within the spirit and scope of the claims.

What is claimed is:

1. A header assembly comprising:

an insulative contact housing comprising a plurality of walls defining an interior cavity;

a plurality of contacts within said cavity and extending through one of said walls to an exterior of said contact housing for surface mounting to a circuit board at board engagement areas of said contacts; and an insulative alignment housing comprising at least one alignment rib extending on an exterior surface thereof, said alignment housing separately provided from and independently mounted to said contact housing, said alignment rib abutting said contacts proximate said board engagement areas, said alignment rib forcing said contacts toward the circuit board and holding the contacts in a coplanar orientation for surface mounting to the circuit board.

2. A header assembly in accordance with claim 1 wherein said contact housing comprises longitudinal side walls and lateral side walls defining the interior cavity, one of said side walls extending along an exterior surface of the circuit board.

3. A header assembly in accordance with claim 1 wherein said alignment housing comprises a plurality of walls defining an alignment cavity, said contact housing comprises longitudinal side walls, lateral side walls, and a contact interface, said contacts extending through said contact interface in a plurality of rows into said alignment cavity.

4. A header assembly in accordance with claim 1 wherein said contact housing further comprises a contact interface and a plug interface for mating with a plug assembly, said plug interface extending substantially parallel to and spaced apart from said contact interface, and said plug interface extending substantially perpendicular to an exterior surface of the circuit board.

5. A header assembly in accordance with claim 1 wherein said alignment housing is releasably mounted to said wall through which said plurality of contacts extend.

6. A header assembly in accordance with claim 1 wherein said contacts are flexed by said alignment rib to load said contacts against said alignment rib.

7. A header assembly in accordance with claim 1 wherein said alignment rib is positioned a substantially uniform distance from an engagement surface of a circuit board such that a gap is defined between the alignment rib and the engagement surface, said contacts abutting the alignment rib and substantially filling the gap.

8. A header assembly in accordance with claim 1 wherein said alignment rib engages said contacts as said alignment housing is mounted to said contact housing, thereby preloading said contacts against said alignment rib.

9. A header assembly in accordance with claim 1 wherein said alignment housing further comprises a board mount feature attached to the exterior surface thereof, said board mount feature comprising a circuit board engagement surface coplanar with said contacts when said contacts are abutted against said alignment rib.

10. A header assembly in accordance with claim 1 wherein said alignment housing further comprises a positioning member comprising a plurality of slots, each of said plurality of contacts engaging a corresponding one of said plurality of slots.

11. A header assembly for engaging an engagement surface of a circuit board comprising:

an insulative contact housing comprising a plurality of walls defining an interior contact cavity and a contact interface;

an insulative alignment housing fitted over a portion of said contact housing, said alignment housing comprising a plurality of walls defining an interior alignment cavity extending proximate said contact interface, and at least one alignment rib extending proximate said alignment cavity, said alignment rib having a planar alignment edge; and a plurality of contacts having contact sections and solder tail sections, said contact sections located within said interior contact cavity, said solder tail sections received within said alignment cavity and a portion of said solder tail sections extending exterior to said alignment cavity, wherein said solder tail sections each have a mounting portion configured to mount to the circuit board, said solder tail sections abutting said alignment edge at said mounting portion and preloaded against said alignment edge as said alignment housing is coupled to said contact housing, thereby ensuring coplanarity of said solder tail sections for surface mounting to the circuit board.

12. A header assembly in accordance with claim 11 wherein said contact housing comprises longitudinal side walls and lateral side walls defining the interior contact cavity, one of said side walls extending along an exterior surface of the circuit board.

13. A header assembly in accordance with claim 11 wherein said contact housing further comprises a plug interface for mating with a plug assembly, said plug interface extending substantially parallel to and spaced apart from said contact interface, and said plug interface extending substantially perpendicular to an exterior surface of the circuit board.

14. A header assembly in accordance with claim 11 wherein said solder tail sections are flexed about said alignment rib.

15. A header assembly in accordance with claim 11 wherein said alignment rib engages said contacts as said alignment housing is mounted to said contact housing, thereby preloading said contacts against said alignment rib.

16. A header assembly in accordance with claim 11 wherein said alignment edge is positioned a substantially uniform distance from the engagement surface of the circuit board such that a gap is defined between the alignment edge and the engagement surface, said contacts abutting the alignment edge and substantially filling the gap.

17. A header assembly in accordance with claim 11 wherein said alignment edge comprises a crowned surface, said solder tail sections abutting said crowned surface.

18. A method of assembling a surface mount header assembly, the assembly including an insulative contact housing including a plurality of walls defining an interior surface, an exterior surface and a plurality of contact apertures extending therebetween, and an insulative alignment housing including a plurality of walls defining an interior surface, an exterior surface and an alignment rib extending on the exterior surface, the assembly further including a plurality of electrical contacts having mounting portions configured to surface mount to a circuit board, the method comprising:

inserting the contacts through the contact apertures;

coupling the alignment housing to the contact housing such that the alignment rib engages the mounting portions of the contacts; and flexing a portion of the contacts against the alignment rib as the alignment housing is coupled to the contact housing, thereby preloading the contacts against the alignment rib in a coplanar relationship with one another.

19. A method in accordance with claim 16 further comprising bending the contacts relative to the exterior surface of the contact housing prior to coupling the alignment housing to the contact housing such that an end of each contacts is angled relative to the exterior surface, the angle of the bent contacts substantially equal among the contacts, such that the ends of the contacts are oriented to contact the alignment housing.

20. A method in accordance with claim 18 wherein said coupling the alignment housing to the contact housing comprises installing a mounting portion of the alignment housing to the exterior surface of the contact housing proximate the contact apertures such that the alignment rib engages each contact when the alignment housing is installed.

* * * * *